United States Patent
Morita et al.

(10) Patent No.: US 6,977,284 B2
(45) Date of Patent: Dec. 20, 2005

(54) POLYMERIZABLE COMPOSITION AND CURED RESIN COMPOSITION

(75) Inventors: Takeharu Morita, Mishima-gun (JP); Nobuhiro Goto, Kyoto (JP); Hiroshi Yoshitani, Kyoto (JP); Hiroshi Hiraike, Mishima-gun (JP)

(73) Assignee: Sekisui Chemical Co., Ltd., Osaka (JP)

( * ) Notice: Subject to any disclaimer, the term of this patent is extended or adjusted under 35 U.S.C. 154(b) by 65 days.

(21) Appl. No.: 10/504,170

(22) PCT Filed: Feb. 17, 2003

(86) PCT No.: PCT/JP03/01623

§ 371 (c)(1),
(2), (4) Date: Sep. 29, 2004

(87) PCT Pub. No.: WO03/068842

PCT Pub. Date: Aug. 21, 2003

(65) Prior Publication Data

US 2005/0065255 A1 Mar. 24, 2005

(30) Foreign Application Priority Data

Feb. 15, 2002 (JP) ........................................ 2002-039202

(51) Int. Cl.⁷ .................................................. C08F 4/42
(52) U.S. Cl. .......................... 526/90; 526/280; 526/281; 526/283; 526/700; 526/790
(58) Field of Search .......................... 526/90, 280, 283; 524/700, 790

(56) References Cited

U.S. PATENT DOCUMENTS 6,310,160 B1 * 10/2001 Kodemura .................. 526/281

FOREIGN PATENT DOCUMENTS

| JP | H10-017676 | | 1/1998 |
| JP | 2001-064488 | | 3/2001 |
| JP | 2003003046 | * | 1/2003 |
| JP | 2003-073529 | | 3/2003 |

* cited by examiner

Primary Examiner—William K. Cheung
(74) Attorney, Agent, or Firm—Sughrue Mion, PLLC

(57) ABSTRACT

It is an object of the present invention to provide a polymerizable composition and a cured resin composition, linear expansion coefficients of which are significantly improved without impairment of the excellent properties such as heat resistance, mechanical strength and the like of norbornene-based resins. The present invention is a polymerizable composition, which comprises a polymerizable substance containing a norbornene-based monomer or oligomer as a main component, a metathesis polymerization catalyst and silica powder, the weight content of the silica powder being larger than the weight content of the polymerizable substance.

9 Claims, No Drawings

POLYMERIZABLE COMPOSITION AND CURED RESIN COMPOSITION

TECHNICAL FIELD

The present invention relates to a polymerizable composition and a cured resin composition, linear expansion coefficients of which are significantly improved without impairment of the excellent properties such as heat resistance, mechanical strength and the like of norbornene-based resins.

BACKGROUND ART

Conventionally, it has been known that norbornene-based monomers yield polymers by a metathesis polymerization reaction. In particular, there is employed a method of obtaining norbornene-based resin molded articles according to a so-called reaction injection molding (RIM) method in which polymerization and molding are simultaneously performed in one step in a die in the presence of a metathesis polymerization catalyst using a norbornene-based monomer which is cheaply available like dicyclopentadiene and the like.

In accordance with this RIM method, large molded articles can be attained using a cheap mold for low pressure molding and, further, the resulting molded articles have the good balance between rigidity and impact resistance. Accordingly, it can be said that the RIM method is one of highly practical molding means which can attain attractive molded articles. Particularly, in recent years, this method is expected to be applied to the uses of insulating substrate materials such as a printed circuit board, a laminate, copper foil with resin, a thin copper clad laminate, a polyimide film, a film for Tape Automated Bonding (TAB) and the like, and of sealing resins which seal the periphery of connecting portions in order to secure the strength of connection in the case of making electric connections between substrates or between a substrate and an electronic device.

However, even though uses, which needed higher rigidity and a lower linear expansion coefficient like this, increased and, correspondingly, enhanced rigidity and reduced linear expansion coefficient have been ever more required, these properties could not be adequately improved in balance by the conventional RIM method.

For this situation, various solving means have been proposed in order to achieve the enhanced rigidity and reduced linear expansion coefficient of the norbornene-based resin molded articles. An example of typical means may include a method of blending a reinforced fiber or a filler. For example, Japanese Kokai Publication Hei-10-17676 discloses a technique of obtaining a norbornene-based resin molded article by curing a norbornene-based resin composition which contains a particulate filler surface-treated in advance with a silane coupling agent, in the presence of a fiber reinforced material surface-treated in advance with a silane coupling agent. In accordance with this method, a molded article of the norbornene-based resin can be obtained with enhanced rigidity and reduced linear expansion coefficient. However, this method presented a problem that productivity would be deteriorated due to the necessity of surface treatment of the filler in advance and, also, a problem that when a filler was charged in a large amount, the norbornene-based resin composition would not flow well because of increased viscosity; therefore, compounded liquid would not flow every hole and corner of a mold. Further, it presented a problem that since air bubbles in the norbornene-based resin composition are hard to deaerate, mechanical properties of the molded article, particularly, mechanical strength is deteriorated.

Thus, it has been strongly required to develop a norbornene-based resin composition providing norbornene-based resin molded articles which have high fluidity and good mechanical properties even though blending conventional reinforced fiber or filler in a large amount.

SUMMARY OF THE INVENTION

It is an object of the present invention to provide a polymerizable composition and a cured resin composition, linear expansion coefficients of which are significantly improved without impairment of the excellent properties such as heat resistance, mechanical strength and the like of norbornene-based resins.

A first aspect of the present invention concerns a polymerizable composition which comprises a polymerizable substance containing a norbornene-based monomer or oligomer as a main component, a metathesis polymerization catalyst, and silica powder, the weight content of the silica powder being larger than the weight content of the polymerizable substance. Preferably, the polymerizable composition according to the first aspect of the present invention, which further comprises a glycerin fatty acid ester, a polyglycerin polyricinoleate ester or a titanate-based coupling agent.

The silica powder is preferably a surface treatment silica surface-treated with a fatty acid or a fatty acid ester. In addition, the silica powder is preferably contained in an amount of 200 to 1,000 parts by weight with respect to 100 parts by weight of the polymerizable substance.

A cured resin composition, which has a crosslinking structure formed by curing the polymerizable composition according to the first aspect of the present invention, the average linear expansion coefficient at a temperature of 20 to 100° C. being $3 \times 10^{-5}/°$ C. or less is also one of the first aspect of the present invention.

A second aspect of the present invention concerns a cured resin composition, which has a crosslinking structure formed by curing the polymerizable composition containing a polymerizable substance containing a norbornene-based monomer or oligomer as a main component, the average linear expansion coefficient at a temperature of 20 to 100° C. being $3 \times 10^{-5}/°$ C. or less, the bending strength measured according to a method specified in JIS K 7055 being 15 GPa or more, and the dielectric constant being 3.5 or less. In the cured resin composition according to the second aspect of the present invention, it is preferred that the water absorption after immersing for 24 hours in water of 23° C. is 1% by weight or less.

DETAILED DISCLOSURE OF THE INVENTION

Hereinafter, the present invention will be described in detail.

As a result of studying intensely, the present inventors have found that when silica powder is selected as a filler to be added to a polymerizable substance and a metathesis polymerization catalyst, it is possible to attain a composition having the viscosity of the order of being adequately moldable even though blending the silica powder in a large amount to a degree that the weight content of the silica powder is larger than the weight content of the polymerizable substance so as to be capable of improving significantly a linear expansion coefficient and the like, leading to the completion of the present invention. Furthermore, as a result of studying intensely, the present inventors have found that when a specific dispersant is used in combination with the silica powder, it is possible to attain a composition having the viscosity of the order of being adequately moldable even though blending an unbelievably large amount of the silica powder.

A polymerizable resin composition according to the first aspect of the present invention comprises a polymerizable substance, a metathesis polymerization catalyst and silica powder.

The polymerizable substance contains a norbornene-based monomer or oligomer as the main component. The norbornene-based monomer or oligomer is not particularly limited as long as it has a norbornene ring, but polycyclic norbornene-based monomers or oligomers, which are tricyclic or morecyclic compounds, are preferable because they yield the articles which are superior in heat resistance, low linear expansion coefficient and the like.

Examples of the norbornene-based monomer may include bicyclic compounds such as norbornene, norbornadiene and the like; tricyclic compounds such as dicyclopentadiene, hydroxydicyclopentadiene and the like; tetracyclic compounds such as tetracyclododecene and the like; pentacyclic compounds such as a cyclopentadiene trimer and the like; heptacyclic compounds such as tetracyclopentadiene and the like; their derivatives having an alkyl group such as methyl, ethyl, propyl, butyl and the like, an alkenyl group such as vinyl and the like, an alkylidene group such as ethylidene and the like, an aryl group such as phenyl, tolyl, naphthyl and the like; and their derivatives having a polar group, containing an element other than carbon and hydrogen, such as an ester group, an ether group, a cyano group, a halogen atom, an alkoxycarbonyl group, a pyridyl group, a hydroxyl group, a carboxylic acid group, an amino group, an acid anhydride group, a silyl group, an epoxy group, an acrylic group, a methacrylic group and the like. In particular, their derivatives having the ester group and the acid anhydride group are preferable from the viewpoint of being capable of providing the reactivity through deprotection. In addition, tricyclic, tetracyclic and pentacyclic monomers are preferable in that they are readily available and highly reactive, and resin molded articles to be obtained have high heat resistance. These norbornene-based monomers may be used alone or in combination of two or more kinds.

Examples of the norbornene-based oligomer may include an oligomer formed by combining several units of the above norbornene-based monomer into one, and the like. Such norbornene-based oligomers may be formed by combining the same kinds of norbornene-based monomers or the different kinds of norbornene-based monomers. These norbornene-based oligomers may be used alone or in combination of two or more kinds.

Additionally, in order to make the resulting polymerizable composition according to the first aspect of the present invention thermosetting, a crosslinkable norbornene-based monomer or oligomer preferably constitutes 10% by weight or more of the above norbornene-based monomer or oligomer contained in the polymerizable substance. The crosslinkable norbornene-based monomer or oligomer more preferably constitutes 30% by weight or more.

The crosslinkable norbornene-based monomers or oligomers represent a polycyclic norbornene-based monomer or oligomer having two or more reactive double bonds. Specific examples thereof may include dicyclopentadiene, tricyclopentadiene, tetracyclopentadiene and the like.

The polymerizable substance may contain a monocyclic cycloolefin, which can cause ring-opening copolymerization with the norbornene-based monomer, such as cyclobutene, cyclopentene, cyclopentadiene, cyclooctene, cyclooctadiene, cyclododecene and the like as a comonomer within the limits of not impairing the purpose of the present invention in order to make the resulting polymerizable composition according to the first aspect of the present invention thermosetting.

The metathesis polymerization catalyst is not particularly limited as long as it is the catalyst capable of polymerizing the norbornene-based monomer by ring-opening through bulk polymerization, and examples thereof may include halides, oxy halides, oxides and organic ammonium salts of tungsten, molybdenum, tantalum, ruthenium, osmium and the like. In particular, a ruthenium-based metathesis polymerization catalyst is suitable.

As the ruthenium-based metathesis polymerization catalyst, a catalyst represented by General formula (1), General formula (3), General formula (4) and General formula (5) are suitably used.

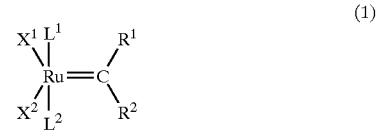

(1)

In General formula (1), each of $R^1$ and $R^2$ represents hydrogen, an alkenyl group having 2 to 20 carbon atoms, an alkyl group having 1 to 20 carbon atoms, an aryl group having 6 to 20 carbon atoms, a carboxyl group having 2 to 20 carbon atoms, an alkoxyl group having 2 to 20 carbon atoms, an alkenyloxy group having 2 to 20 carbon atoms, an aryloxy group having 6 to 20 carbon atoms, an alkoxycarbonyl group having 2 to 20 carbon atoms, an alkylthio group having 2 to 20 carbon atoms, or a ferrocene derivative and, these substances described above may be substituted for a phenyl derivative having an alkyl group having 1 to 5 carbon atoms, a halogen atom or an alkoxyl group having 1 to 5 carbon atoms, if required. In addition, $R^1$ and $R^2$ may be identical with or different from each other.

In General formula (1), each of $X^1$ and $X^2$ represents any anionic ligand, preferably Cl or Br, more preferably Cl. $X^1$ and $X^2$ may be identical with or different from each other.

In General formula (1), each of $L^1$ and $L^2$ represents a neutral electron donor, preferably a phosphoric ligand or an imidazolium compound. $L^1$ and $L^2$ may be identical with or different from each other.

As the phosphoric ligand, phosphine compounds represented by General formula (2) are preferable.

(2)

In General formula (2), each of $R^3$, $R^4$ and $R^5$ represents an alkyl group having 1 to 20 carbon atoms, or an aryl group having 6 to 20 carbon atoms and preferably represents a methyl group, an ethyl group, an isopropyl group, a t-butyl group, a cyclohexyl group, a phenyl group, or a substituted phenyl group. Specific examples thereof may include tricyclohexylphosphine, triphenylphosphine, triisopropylphosphine and the like. $R^3$, $R^4$ and $R^5$ may be identical with or different from one another.

As the imidazolium compound, for example, imidazoline-2-ylidene derivatives or 4,5-dihydroimidazoline-2-ylidene derivatives are preferable. Specific examples thereof may include N,N'-dimesitylimidazoline-2-ylidene ligand, N,N'-dimesityl-4,5-dihydroimidazoline-2-ylidene ligand and the like.

In General formula (1), two or three of $X^1$, $X^2$, $L^1$ and $L^2$ may further join together to form a multidentate chelate ligand.

Further, in General formula (1), $L^1$ and $L^2$, respectively, are shown in a trans-position but they can occupy a cis-coordination depending on bulkiness thereof or in the case where $L^1$ and $L^2$ are identical molecule and bisdentate.

Furthermore, in General formula (1), $X^1$ and $X^2$, respectively, are shown in a cis-position but they can occupy a trans-coordination in some kinds of $L^1$ and $L^2$.

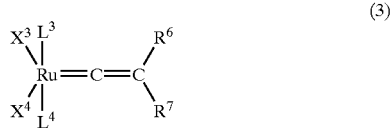
(3)

In General formula (3), each of $R^6$ and $R^7$ represents hydrogen, an alkenyl group having 2 to 20 carbon atoms, an alkyl group having 1 to 20 carbon atoms, an aryl group having 6 to 20 carbon atoms, a carboxyl group having 2 to 20 carbon atoms, an alkoxyl group having 2 to 20 carbon atoms, an alkenyloxy group having 2 to 20 carbon atoms, an aryloxy group having 6 to 20 carbon atoms, an alkoxycarbonyl group having 2 to 20 carbon atoms, an alkylthio group having 2 to 20 carbon atoms, or a ferrocene derivative and, these substances described above may be substituted for a phenyl derivative having an alkyl group having 1 to 5 carbon atoms, a halogen atom or an alkoxyl group having 1 to 5 carbon atoms, if required. In addition, $R^6$ and $R^7$ may be identical with or different from each other.

However, when an alkylsilyl group or an arylsilyl group is used as $R^6$, two or more of the same alkyl groups or aryl groups can be selected redundantly on silicon because of the stability of its complex, and in doing so, a methyl group, an ethyl group, an isopropyl group, a t-butyl group, a cyclohexyl group and a phenyl group are preferable. Specifically, there are given a trimethylsilyl group, a triethylsilyl group, a diphenylmethylsilyl group, a dimethyl-t-butylsilyl group, a triisopropylsilyl group and the like. In this case, as $R^7$, a t-butyl group, a n-butyl group, a n-propyl group, an isopropyl group, an ethyl group, a methyl group, a methoxymethyl group, a ferrocenyl group, a trimethylsilyl group, a phenyl group, a tolyl group, an anisyl group and the like are preferable from the viewpoint of the stability and the activity of a complex.

In General formula (3), each of $X^3$ and $X^4$ represents any anionic ligand, preferably Cl or Br, more preferably Cl. $X^3$ and $X^4$ may be identical with or different from each other.

In General formula (3), each of $L^3$ and $L^4$ represents a neutral electron donor, preferably a phosphoric ligand or an imidazolium compound. $L^3$ and $L^4$ may be identical with or different from each other.

As the phosphoric ligand and the imidazolium compound, the substances described above are given.

Further, in General formula (3), two or three of $X^3$, $X^4$, $L^3$ and $L^4$ may further join together to form a multidentate chelate ligand.

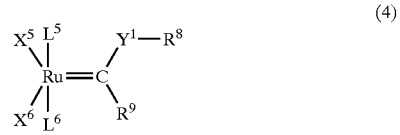
(4)

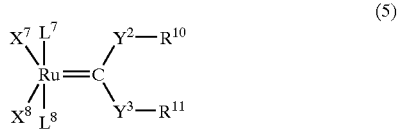
(5)

In General formula (4) or General formula (5), each of $R^8$, $R^9$, $R^{10}$ and $R^{11}$ represents hydrogen, an alkenyl group having 2 to 20 carbon atoms, an alkyl group having 1 to 20 carbon atoms, an aryl group having 6 to 20 carbon atoms, a carboxyl group having 2 to 20 carbon atoms, an alkoxyl group having 2 to 20 carbon atoms, an alkenyloxy group having 2 to 20 carbon atoms, an aryloxy group having 6 to 20 carbon atoms, an alkoxycarbonyl group having 2 to 20 carbon atoms, an alkylthio group having 2 to 20 carbon atoms, or a ferrocene derivative and, these substances described above may be substituted for a phenyl derivative having an alkyl group having 1 to 5 carbon atoms, a halogen atom or an alkoxyl group having 1 to 5 carbon atoms, if required. In addition, $R^8$, $R^9$, $R^{10}$ and $R^{11}$ may be identical with or different from one another.

In particular, as the $R^8$, $R^{10}$ and $R^{11}$, an alkyl group having 1 to 20 carbon atoms, a cyclohexyl group, a phenyl group; and a phenyl derivatives having an alkyl group having 1 to 5 carbon atoms, an alkyloxy group having 1 to 5 carbon atoms, a carboxyl group, an alkylsilyl group having 1 to 5 carbon atoms, a hydroxyl group, a nitro group, halogen, an amino group having 5 or less carbon atoms, an acetyl group and an acetoxy group are more preferable. In particular, a phenyl group, an o-tolyl group, a p-tolyl group, a 2,6-xylyl group, an anisyl group, a nitrobenzene group, a chlorobenzene group, an o-isopropylphenyl group, a 2,6-diisopropylphenyl group, an ethyl group, an isopropyl group, a t-butyl group and a cyclohexyl group are more preferable.

In General formula (4) or General formula (5), each of $Y^1$, $Y^2$ and $Y^3$ represents sulfur, oxygen and selenium, preferably sulfur and selenium element. $Y^1$, $Y^2$ and $Y^3$ may be identical with or different from one another.

In General formula (4) or General formula (5), each of $X^5$, $X^6$, $X^7$ and $X^8$ represents any anionic ligand, preferably Cl or Br, more preferably Cl. $X^5$, $X^6$, $X^7$ and $X^8$ may be identical with or different from one another.

In General formula (4) or General formula (5), each of $L^5$, $L^6$, $L^7$ and $L^8$ represents a neutral electron donor, preferably a phosphoric ligand or an imidazolium compound. $L^5$, $L^6$, $L^7$ and $L^8$ may be identical with or different from one another.

As the phosphoric ligand and the imidazolium compound, the substances described above are given.

Further, in General formula (4) or General formula (5), two or three of $X^5$, $X^6$, $X^7$, $X^8$, $L^5$, $L^6$, $L^7$ and $L^8$ may further join together to form a multidentate chelate ligand.

A method of producing the ruthenium-based metathesis polymerization catalyst represented by General formula (1), General formula (3), General formula (4) and General formula (5) is not particularly limited, and includes, for example, a method in which a raw material such as ligand precursors having $L^1$ to $L^8$ and the like is synthesized according to a publicly known method and, on the other hand, a raw material of the precursor of a ruthenium complex is synthesized according to a publicly known method, and finally both raw materials are mixed and a ligand-exchange reaction is performed to produce the ruthenium-based metathesis polymerization catalyst.

The content of the above-mentioned metathesis polymerization catalyst is preferably 0.0001 to 1 mol % with respect to the norbornene-based monomer or oligomer contained in the polymerizable substance. When this content is less than 0.0001 mol %, a polymerization rate of the norbornene-based monomer or oligomer may be low and impractical. When it is more than 1 mol %, the polymerizable composition is economically disadvantageous. The content is more preferably 0.001 to 0.5 mol %, and furthermore preferably 0.001 to 0.05 mol %.

The above-mentioned silica powder plays a role as a filler in the polymerizable composition according to the first aspect of the present invention and contributes to the higher rigidity and the reduced linear expansion coefficient. The silica powder does not inhibit a polymerization reaction of a norbornene-based monomer and a norbornene-based oligomer. By using silica powder as a filler, the polymerizable composition according to the first aspect of the present invention can improve the properties such as the linear expansion coefficient while retaining high moldability even though blending an extremely large amount of the filler.

The silica powder is preferably surface-treated with a fatty acid or a fatty acid ester. Thereby, the wettability of the silica powder is improved and the silica powder can be more uniformly dispersed in the polymerizable composition.

The fatty acid and fatty acid ester are not particularly limited, and for example, a ricinoleate ester, a glycerin fatty acid ester and the like are suitably used. As the above-mentioned ricinoleate ester and the glycerin fatty acid ester, there are given substances similar to substances used as a dispersant described below.

The shape of the silica powder is not particularly limited, but it is preferably spherical in shape. An average particle diameter of the silica powder is preferably 100 nm to 100 μm, more preferably 1 to 20 μm.

In the polymerizable composition according to the first aspect of the present invention, the weight content of the silica powder is larger than the weight content of the polymerizable substance. The amount of the silica powder to be blended in the polymerizable composition according to the first aspect of the present invention is preferably 200 to 1,000 parts by weight with respect to 100 parts by weight of the polymerizable substance. When this amount is less than 200 parts by weight, the linear expansion coefficient of the cured resin composition to be obtained becomes large; therefore, the cured resin composition may not be suitable for use in which a high precision is required, such as sealing of an optical circuit. When it is more than 1,000 parts by weight, the fluidity of the polymerizable composition becomes poor; therefore, handlability and processability may be deteriorated. The amount is more preferably 500 to 1,000 parts by weight and furthermore preferably 800 to 1,000 parts by weight. Conventionally, it has been thought that even though such a large amount of filler was offered to be blended, blending itself was impossible or even though the filler could be blended, molding became difficult due to an increase in the viscosity of a composition to be obtained or contrariwise properties such as mechanical strength were impaired. However, in the polymerizable composition according to the first aspect of the present invention, by selecting the silica powder as a filler, it is possible to blend the silica powder in an amount exceeding the weight content of a polymerizable substance. Further, it becomes possible to blend an unbelievably large amount of the silica powder in the case of using a specific dispersant described below in combination.

Preferably, the polymerizable composition according to the first aspect of the present invention further comprises at least one kind selected from the group consisting of a glycerin fatty acid ester, a polyglycerin polyricinoleate ester and a titanate-based coupling agent. These play a role as a dispersant to enhance the dispersibility of the silica powder. By using these dispersants in combination, the resulting polymerizable composition according to the first aspect of the present invention can retain high moldability even though blending an extremely large amount of the silica powder. Blending of these dispersant is effective in improving the mechanical and physical properties since this blending has the effect of promoting deaeration of the polymerizable composition and allows voids in the cured resin composition to be obtained to decrease.

Examples of the glycerin fatty acid ester may include diglycerin distearate, diglycerin monostearate, diglycerin monooleate, diglycerin dioleate, hexaglycerin monostearate, hexaglycerin monooleate, hexaglycerin monomyristate, hexaglycerin monolaurate, hexaglycerin monocaprylate, hexaglycerin dicaprylate, hexaglycerin hexastearate, hexaglycerin octastearate, decaglycerin monostearate, decaglycerin distearate, decaglycerin pentastearate, decaglycerin decastearate, decaglycerin monooleate, decaglycerin pentaoleate, decaglycerin decaoleate, decaglycerin monomyristate, decaglycerin monolaurate, triglycerin monolaurate, triglycerin monomyristate, triglycerin monooleate, triglycerin monostearate, pentaglycerin monolaurate, pentaglycerin monomyristate, pentaglycerin trimyristate, pentaglycerin monooleate, pentaglycerin trioleate, pentaglycerin monostearate, pentaglycerin tristearate, pentaglycerin hexastearate, and the like. These glycerin fatty acid esters may be used alone or in combination of two or more kinds.

Examples of the polyglycerin polyricinoleate ester may include tetraglycerin polyricinoleate, hexaglycerin polyricinoleate, pentaglycerin polyricinoleate, and the like. These polyglycerin polyricinoleate esters may be used alone or in combination of two or more kinds.

Examples of the titanate-based coupling agent may include triisostearoyl isopropyl titanate, di(dioctylphosphate)diisopropyl titanate, didodecylbenzenesulfonyl diisopropyl titanate, diisostearyl diisopropyl titanate, isopropyltris(dioctylpyrophosphate)titanate, bis(dioctylpyrophosphate)oxyacetate titanate, bis(dioctylpyrophosphate)ethylene titanate, tetraisopropylbis(dioctylphosphate)titanate, tetraoctylbis(ditridecylphosphate)titanate, and the like. These titanate-based coupling agents may be used alone or in combination of two or more kinds.

In the polymerizable composition according to the first aspect of the present invention, the amount of the dispersant to be blended may be appropriately established depending on the amount of the silica powder, and is preferably, but not particularly limited to, 0.1 to 5 parts by weight with respect to 100 parts by weight of the norbornene-based monomer or oligomer.

A method of preparing the polymerizable composition according to the first aspect of the present invention is not particularly limited, and includes, for example, a method in which the polymerizable substance and the dispersant are mixed and stirred, and to this is added a predetermined amount of the silica powder and the mixture is stirred, and to this mixture is added a predetermined amount of the metathesis polymerization catalyst dissolved in an appropriate solvent and the resulting mixture is mixed.

The polymerizable composition according to the first aspect of the present invention comprises a polymerizable substance containing a norbornene-based monomer or oligomer as a main component, a metathesis polymerization catalyst and silica powder. Since it contains silica powder at a high filling rate, by curing it, it is possible to obtain the cured resin composition which is superior in the heat resistance and the mechanical strength, and realizes the low linear expansion coefficient. Furthermore, this polymerizable composition has high fluidity and can be surely poured every hole and corner of a mold even though it contains the silica powder in a large amount, so that it can attain excellent norbornene-based resin molded articles by a reaction injection molding (RIM) method, a casting method or a spin coating method.

The polymerizable composition according to the first aspect of the present invention gives molded articles by being cured and, in addition, can be suitably used as a sealing resin which seals the periphery of connecting portions in order to secure the strength of connection in the case of making electric connections between substrates or between a substrate and an electronic device. Particularly when this polymerizable composition is used as a sealing resin, a highly reliable circuit can be prepared without causing peeling or deviation even in the case where a positional precision and a dimensional precision are required as in an optical circuit (and an integrated circuit) due to the fact that residual strain is less and because of high fluidity prior to curing, air bubbles do not remain in a cured article after curing.

When the polymerizable composition according to the first aspect of the present invention contains the definite amount of a crosslinkable norbornene-based monomer or oligomer as the polymerizable composition, it is cured since a polymerization reaction proceeds by a self-exothermic reaction, and a cured resin composition having a crosslinking structure of which an average linear expansion coefficient at a temperature of 20 to 100° C. is $3 \times 10^{-5}/$° C. or less is obtained. Further, in producing the cured resin composition, the polymerizable composition may be heated in order to promote the polymerization reaction.

The present invention also provides a cured resin composition having a crosslinking structure formed by curing such a polymerizable composition according to the first aspect of the present invention, of which an average linear expansion coefficient at a temperature of 20 to 100° C. is $3 \times 10^{-5}/$° C. or less.

When the average linear expansion coefficient at a temperature of 20 to 100° C. is more than $3 \times 10^{-5}/$° C., peeling and deviation will arise and reliability of a circuit will be deteriorated in the case where the cured resin composition is used for a seal in which a positional precision and a dimensional precision are required as in an optical circuit (and an integrated circuit).

The second aspect of the present invention concerns a cured resin composition having a crosslinking structure formed by curing the polymerizable composition comprising a polymerizable substance containing a norbornene-based monomer or oligomer as a main component, wherein the average linear expansion coefficient at a temperature of 20 to 100° C. is $3 \times 10^{-5}/$° C. or less, the bending strength measured according to a method specified in JIS K 7055 is 15 GPa or more, and the dielectric constant is 3.5 or less.

When the average linear expansion coefficient at a temperature of 20 to 100° C. is more than $3 \times 10^{-5}/$° C., peeling and deviation will arise and reliability of a circuit will be deteriorated in the case where the cured resin composition is used for a seal in which a positional precision and a dimensional precision are required as in an optical circuit (and an integrated circuit).

When the bending strength is less than 15 GPa, the strength may be insufficient in the case where the cured resin composition used for a seal in which a positional precision and a dimensional precision are required as in an optical circuit (and an integrated circuit).

In addition, when the cured resin composition according to the second aspect of the present invention is used as a material for an insulating substrate, it is required that its dielectric constant is low. That is, it is necessary to speed a signal transfer rate for a speedup of information processing and the signal transfer rate becomes faster in a material having a lower relative dielectric constant; therefore, the material having a lower dielectric constant allows the information processing to speed. In a material used for information and communication area in which there has been a growing trend of higher frequencies, since effects on heat generation in a circuit of a printed board increase and transmission losses become large due to a high frequency, materials of printed circuit boards, which are low in a dielectric dissipation factor and a relative dielectric constant, can transfer signals more efficiently, that is, with less transmission losses. Further, when the relative dielectric constant is low, there is the advantage that an insulating layer with thin thickness can be designed, and it becomes possible to design a circuit with more wide area compared with a printed circuit board with the same thickness, which is made of a high dielectric constant material and processing becomes easy. Though epoxy resins have been conventionally used as a material for an insulating substrate, the limitations of the dielectric constant was 3.9 in the epoxy resins. The cured resin composition according to the second aspect of the present invention is formed by polymerizing the norbornene-based monomer or oligomer and, therefore, could realize a reduced dielectric constant of 3.5 or lower in a dielectric constant.

With respect to the cured resin composition according to the second aspect of the present invention, it is preferred that the water absorption after immersing for 24 hours in water of 23° C. is 1% by weight or less. Though the water absorption of epoxy resins conventionally used in materials for insulating substrates was 1% by weight or more, materials having the low water absorption have been required since the high water absorption of a substrate or an underfill portion may cause a short in a circuit and a decrease in a processing rate. In the case where the cured resin composition is employed in sealing of an optical circuit, since a refractive index of light is varied due to the presence of water, a material having high water absorption decreases in transmission stability and increases in attenuation in optical communications, so that it can not be employed in large-capacity long-haul communications. The cured resin composition according to the second aspect of the present invention is superior to the conventional epoxy resins because its water absorption is 1% by weight or less. The water absorption is more preferably 0.5% by weight or less.

The cured resin composition according to the second aspect of the present invention may be produced, for example, by polymerizing the polymerizable composition according to the first aspect of the present invention and curing the resulting polymer. The cured resin composition according to the second aspect of the present invention, having the above-mentioned properties, has not been present, but it can be readily produced when the polymerizable composition according to the first aspect of the present invention is used.

The cured resin composition according to the first aspect of the present invention is one, the linear expansion coefficient of which is significantly improved without impairment of the heat resistance and the mechanical strength which norbornene-based resins have. When the polymerizable composition according to the first aspect of the present invention is used, since it has high fluidity before curing even though it contains the silica powder at high charging rate, it has good moldability and a molded article is readily obtained with high accuracy.

The cured resin composition according to the second aspect of the present invention is suitable for the insulating substrate materials such as a printed circuit board, a laminate, copper foil with resin, a thin copper clad laminate, a polyimide film, a film for Tape Automated Bonding (TAB) and the like. Further, on the occasion of molding, the cured resin composition according to the second aspect of the present invention may be molded alone, but it can be combined with a reinforced material such as glass cloth to form a single composite because of high fluidity.

BEST MODE FOR CARRYING OUT THE INVENTION

Hereinafter, the present invention will be described in detail by way of examples, but the present invention is not limited to these examples.

(Metathesis Polymerization Catalyst 1)

18.2 mmol of tricyclohexylphosphine and 9.1 mmol of t-butylacetylene were added to 5.57 g (9.1 mmol) of dichloro(p-cymene)ruthenium and this mixture was reacted for 7 hours together with 150 ml of toluene under nitrogen flow in a 300 ml flask. A ruthenium-based metathesis polymerization catalyst represented by Formula (6) was obtained by removing toluene under a reduced pressure after the completion of the reaction and recrystallizing the remainder in a tetrahydrofuran/ethanol system.

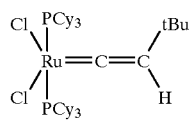
(6)

(Metathesis Polymerization Catalyst 2)

A ruthenium-based metathesis polymerization catalyst represented by Formula (7) (Bis(tricyclohexylphosphine) benzylidene ruthenium(IV) dichloride, made by STREM Chemicals, Inc.) was used.

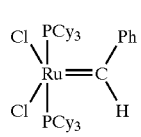
(7)

(Metathesis Polymerization Catalyst 3)

In a 50 ml Schlenk flask, the interior of which was displaced with nitrogen gas, 2 mmol of bis (tricyclohexylphosphine)benzylidene ruthenium(IV) dichloride represented by Formula (7) was put, and 20 ml of toluene was-added thereto and the mixture was dissolved. 2.2 mmol of phenylvinyl sulfide was added to this dissolved solution and the mixture was stirred at room temperature for 8 hours. A ruthenium-based metathesis polymerization catalyst represented by Formula (8) was obtained by removing a solvent under a reduced pressure after the completion of the reaction, washing a resulting solid matter with cold acetone and drying it.

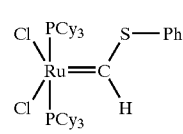
(8)

(Metathesis Polymerization Catalyst 4)

In a 50 ml Schlenk flask, the interior of which was displaced with nitrogen gas, 2 mmol of bis (triisopropylphosphine)benzylidene ruthenium(IV) dichloride represented by Formula (9), which had been synthesized according to a method described in J. Am. Chem. Soc., 118, 100 (1996), was put. 20 ml of toluene was added thereto and the mixture was dissolved. 2.2 mmol of phenylvinyl sulfide was added to this dissolved solution and the mixture was stirred at room temperature for 8 hours. A ruthenium-based metathesis polymerization catalyst represented by Formula (10) was obtained by removing a solvent under a reduced pressure after the completion of the reaction, washing a resulting solid matter with cold acetone and drying it.

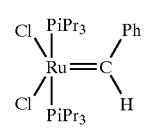
(9)

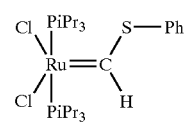
(10)

EXAMPLE 1

A mixture of 80 parts by weight of dicyclopentadiene (made by Maruzen Petrochemical Co., Ltd.) and 20 parts by weight of tricyclopentadiene (made by Maruzen Petrochemical Co., Ltd.) was used as a norbornene-based monomer, and 2 parts by weight of a titanate-based coupling agent (PLENACT KR46B, made by Ajinomoto Fine-Techno Co., Ltd.) was blended into this norbornene-based monomer mixture as a dispersant and the blended mixture was mixed and stirred. Next, 300 parts by weight of fused silica (FB-24, made by DENKI KAGAKU KOGYO KABUSHIKI KAISHA, average particle diameter: 18 μm) was blended under stirring. Further, a polymerization catalyst solution, which was formed by dissolving 10 parts by weight of a ruthenium-based metathesis polymerization catalyst of Formula (6) in 200 parts by weight of toluene as a metathesis polymerization catalyst, was added thereto at 25° C. in such a manner that the rate of the metathesis polymerization catalyst is 0.0001 mol % with respect to the norbornene-based monomer, and this mixture was stirred to obtain a polymerizable composition.

The resulting polymerizable composition was poured into a flat plate mold and then cured by being heated at 40° C. for 1 hour and 120° C. for 1 hour to prepare a flat plate made of a cured resin composition.

With respect to the resulting flat plate made of the polymerizable composition and the cured resin composition, the following evaluations were carried out. The results of evaluations were shown in Table 1.

(Measurement of Viscosity of Polymerizable Composition)

The viscosity of the polymerizable composition was measured using a Brookfield type viscometer.

(Measurement of Bending Strength and Bending Modulus)

The bending strength and the bending modulus of the flat plate were measured according to a method specified in JIS K 7055.

(Measurement of Average Linear Expansion Coefficient)

With respect to the flat plate, TMA measurement was carried out according to a method specified in JIS K 7197, and the average linear expansion coefficient in a range of 20° C. to 100° C. was determined.

(Measurement of Water Absorption)

With respect to the flat plate, the water absorption after immersing for 24 hours in water of 23° C. was measured according to a method specified in JIS K 7209.

(Measurement of Dielectric Constant and Dielectric Dissipation Factor)

With respect to the flat plate, the dielectric constant and the dielectric dissipation factor at each frequency were measured using an impedance analyzer (4291B RF impedance/material analyzer, manufactured by Agilent Technologies Inc.), and a dielectric test fixture 16453A (sample material specification, diameter: 15 mm or more, thickness: 0.3 to 3 mm)

EXAMPLE 2

A flat plate made of a polymerizable composition and a cured resin composition was obtained by following the same procedure as that in Example 1 except for using a ruthenium-based metathesis polymerization catalyst of Formula (7) as a metathesis polymerization catalyst, and the evaluations thereof were carried out. The results of evaluations were shown in Table 1.

EXAMPLE 3

A flat plate made of a polymerizable composition and a cured resin composition was obtained by following the same procedure as that in Example 1 except for using a ruthenium-based metathesis polymerization catalyst of Formula (7) as a metathesis polymerization catalyst and 2 parts by weight of a polyglycerin polyricinoleate ester (CHIRABAZOL H-818, made by Taiyo Kagaku Co., Ltd.) as a dispersant, and the evaluations thereof were carried out. The results of evaluations were shown in Table 1.

EXAMPLE 4

A flat plate made of a polymerizable composition and a cured resin composition was obtained by following the same procedure as that in Example 1 except for using a ruthenium-based metathesis polymerization catalyst of Formula (8) as a metathesis polymerization catalyst and 2 parts by weight of a polyglycerin polyricinoleate ester (CHIRABAZOL H-818, made by Taiyo Kagaku Co., Ltd.) as a dispersant, and the evaluations thereof were carried out. The results of evaluations were shown in Table 1.

EXAMPLE 5

A flat plate made of a polymerizable composition and a cured resin composition was obtained by following the same procedure as that in Example 1 except for changing the amount of the fused silica to be mixed from 300 parts by weight to 400 parts by weight, and the evaluations thereof were carried out. The results of evaluations were shown in Table 1.

EXAMPLE 6

A flat plate made of a polymerizable composition and a cured resin composition was obtained by following the same procedure as that in Example 5 except for using a ruthenium-based metathesis polymerization catalyst of Formula (7) as a metathesis polymerization catalyst, and the evaluations similar to Example 1 were carried out. The results of evaluations were shown in Table 1.

TABLE 1

|  |  | Example 1 | Example 2 | Example 3 |
|---|---|---|---|---|
| Composition | Monomer | Dicyclopentadiene/ tricyclopentadiene | Dicyclopentadiene/ tricyclopentadiene | Dicyclopentadiene/ tricyclopentadiene |
|  | Catalyst | Formula (6) | Formula (7) | Formula (7) |
|  | Dispersant | PLENACT KR46B | PLENACT KR46B | CHIRABAZOL H-818 |
|  | Fused silica | FB-24 | FB-24 | FB-24 |
|  | Amount of fused silica to be mixed (parts by weight) | 300 | 300 | 300 |
| Evaluation | Viscosity (Pa · s) | 0.32 | 0.31 | 0.31 |
|  | Bending strength (MPa) | 42.1 | 43.6 | 44.0 |
|  | Bending modulus (GPa) | 7.4 | 7.5 | 7.5 |
|  | Linear expansion coefficient ($\times 10^{-6}$/° C.) | 17.0 | 16.3 | 16.4 |
|  | Water absorption (%) | 0.10 | 0.09 | 0.07 |
|  | Dielectric constant (1 MHz) | 2.76 | 2.76 | 2.79 |
|  | (100 MHz) | 2.80 | 2.81 | 2.78 |
|  | (1 GHz) | 2.78 | 2.83 | 2.81 |
|  | Dielectric dissipation factor (1 MHz) | 0.0012 | 0.0012 | 0.0012 |
|  | (100 MHz) | 0.0014 | 0.0013 | 0.0012 |
|  | (1 GHz) | 0.0012 | 0.0013 | 0.0014 |

TABLE 1-continued

| | | Example 4 | Example 5 | Example 6 |
|---|---|---|---|---|
| Composition | Monomer | Dicyclopentadiene/ tricyclopentadiene | Dicyclopentadiene/ tricyclopentadiene | Dicyclopentadiene/ tricyclopentadiene |
| | Catalyst | Formula (8) | Formula (6) | Formula (7) |
| | Dispersant | CHIRABAZOL H-818 | PLENACT KR46B | PLENACT KR46B |
| | Fused silica | FB-24 | FB-24 | FB-24 |
| | Amount of fused silica to be mixed (parts by weight) | 300 | 400 | 400 |
| Evaluation | Viscosity (Pa · s) | 0.35 | 0.91 | 0.89 |
| | Bending strength (MPa) | 41.2 | 32.6 | 33.2 |
| | Bending modulus (GPa) | 7.3 | 8.3 | 8.4 |
| | Linear expansion coefficient ($\times 10^{-6}/°$ C.) | 17.8 | 13.5 | 13.3 |
| | Water absorption (%) | 0.10 | 0.11 | 0.10 |
| | Dielectric constant (1 MHz) | 2.76 | 3.02 | 2.99 |
| | (100 MHz) | 2.77 | 3.12 | 3.00 |
| | (1 GHz) | 2.78 | 3.12 | 3.00 |
| | Dielectric dissipation factor (1 MHz) | 0.0015 | 0.0013 | 0.0012 |
| | (100 MHz) | 0.0016 | 0.0015 | 0.0012 |
| | (1 GHz) | 0.0016 | 0.0012 | 0.0015 |

EXAMPLE 7

A flat plate made of a polymerizable composition and a cured resin composition was obtained by following the same procedure as that in Example 5 except for using a ruthenium-based metathesis polymerization catalyst of Formula (7) as a metathesis polymerization catalyst and 2 parts by weight of a polyglycerin polyricinoleate ester (CHIRABAZOL H-818, made by Taiyo Kagaku Co., Ltd.) as a dispersant, and the evaluations similar to Example 1 were carried out. The results of evaluations were shown in Table 2.

EXAMPLE 8

A flat plate made of a polymerizable composition and a cured resin composition was obtained by following the same procedure as that in Example 5 except for using a ruthenium-based metathesis polymerization catalyst of Formula (8) as a metathesis polymerization catalyst and 2 parts by weight of a polyglycerin polyricinoleate ester (CHIRABAZOL H-818, made by Taiyo Kagaku Co., Ltd.) as a dispersant, and the evaluations similar to Example 1 were carried out. The results of evaluations were shown in Table 2.

COMPARATIVE EXAMPLE 1

A mixture of 80 parts by weight of dicyclopentadiene (made by Maruzen Petrochemical Co., Ltd.) and 20 parts by weight of tricyclopentadiene (made by Maruzen Petrochemical Co., Ltd.) was used as a norbornene-based monomer, and a polymerization catalyst solution, which was formed by dissolving 10 parts by weight of a ruthenium-based metathesis polymerization catalyst of Formula (8) in 200 parts by weight of toluene as a metathesis polymerization catalyst, was added thereto at 25° C. in such a manner that the rate of the metathesis polymerization catalyst is 0.0001 mol % with respect to the norbornene-based monomer, and this mixture was stirred to obtain a polymerizable composition.

The resulting polymerizable composition was poured into a flat plate mold and then cured by being heated at 40° C. for 1 hour and 120° C. for 1 hour to prepare a flat plate made of a cured resin composition.

With respect to the resulting flat plate made of the polymerizable composition and the cured resin composition, the evaluations similar to Example 1 were carried out. The results of evaluations were shown in Table 2.

COMPARATIVE EXAMPLE 2

A substance, which is formed by adding 5 parts by weight of a curing agent (isocyanuric acid adduct 2MA-OK, made by Shikoku Corp.) to 100 parts by weight of an epoxy resin (bisphenol A RE-310S, made by NIPPON KAYAKU CO., Ltd.), was poured into a flat plate mold and then cured by being heated at 100° C. for 2 hours and 150° C. for 3 hours to prepare a flat plate made of a cured resin composition.

With respect to the flat plate made of the epoxy resin and the cured resin composition, the evaluations similar to Example 1 were carried out. The results of evaluations were shown in Table 2.

COMPARATIVE EXAMPLE 3

Into 100 parts by weight of an epoxy resin (bisphenol A RE-310S, made by NIPPON KAYAKU CO., Ltd.), 5 parts by weight of a curing agent (isocyanuric acid adduct 2MA-OK, made by Shikoku Corp.) and 2 parts by weight of a titanate-based coupling agent (PLENACT KR46B, made by Ajinomoto Fine-Techno Co., Ltd.) as a dispersant were blended and the blended mixture was mixed and stirred. Next, 400 parts by weight of fused silica (FB-24, made by DENKI KAGAKU KOGYO KABUSHIKI KAISHA, average particle diameter: 18 μm) was blended under stirring to obtain a polymerizable composition.

The resulting polymerizable composition was poured into a flat plate mold and then cured by being heated at 100° C. for 2 hour and 150° C. for 3 hours to prepare a flat plate made of a cured resin composition.

With respect to the resulting flat plate made of the polymerizable composition and the cured resin composition, the evaluations similar to Example 1 were carried out. The results of evaluations were shown in Table 2.

COMPARATIVE EXAMPLE 4

A mixture of 80 parts by weight of dicyclopentadiene (made by Maruzen Petrochemical Co., Ltd.) and 20 parts by weight of tricyclopentadiene (made by Maruzen Petrochemical Co., Ltd.) was used as a norbornene-based monomer, and into this norbornene-based monomer mixture, 2 parts by weight of a silane coupling agent (SILA-ACE S210, made by CHISSO CORP.) was blended as a dispersant and the blended mixture was mixed and stirred. Next, 300 parts by weight of calcium carbonate having an average particle diameter (an average particle diameter refers to a diameter at a cumulative-weight of 50% of a particle size distribution) of 12 μm was blended under stirring. Further, a polymerization catalyst solution, which was formed by dissolving 10 parts by weight of a ruthenium-based metathesis polymerization catalyst of Formula (8) in 200 parts by weight of toluene as a metathesis polymerization catalyst, was added thereto at 25° C. in such a manner that the rate of the metathesis polymerization catalyst is 0.0001 mol % with respect to the norbornene-based monomer, and this mixture was stirred to obtain a polymerizable composition.

The resulting polymerizable composition was poured into a flat plate mold and then cured by being heated at 40° C. for 1 hour and 120° C. for 1 hour to prepare a flat plate made of a cured resin composition.

With respect to the resulting flat plate made of the polymerizable composition and the cured resin composition, the evaluations similar to Example 1 were carried out. The results of evaluations were shown in Table 2.

COMPARATIVE EXAMPLE 5

A mixture of 80 parts by weight of dicyclopentadiene (made by Maruzen Petrochemical Co., Ltd.) and 20 parts by weight of tricyclopentadiene (made by Maruzen Petrochemical Co., Ltd.) was used as a norbornene-based monomer, and into this norbornene-based monomer mixture, 2 parts by weight of a silane coupling agent (SH6040, made by Dow Corning Toray Silicone Co., Ltd.) was blended as a dispersant and the blended mixture was mixed and stirred. Next, 400 parts by weight of calcium carbonate having an average particle diameter (an average particle diameter refers to a diameter at a cumulative-weight of 50% of a particle size distribution) of 12 μm was blended under stirring. Further, a polymerization catalyst solution, which was formed by dissolving 10 parts by weight of a ruthenium-based metathesis polymerization catalyst of Formula (8) in 200 parts by weight of toluene as a metathesis polymerization catalyst, was added thereto at 25° C. in such a manner that the rate of the metathesis polymerization catalyst is 0.0001 mol % with respect to the norbornene-based monomer, and this mixture was stirred to obtain a polymerizable composition.

The resulting polymerizable composition was poured into a flat plate mold and then cured by being heated at 40° C. for 1 hour and 120° C. for 1 hour to prepare a flat plate made of a cured resin composition.

With respect to the resulting flat plate made of the polymerizable composition and the cured resin composition, the evaluations similar to Example 1 were carried out. The results of evaluations were shown in Table 2.

TABLE 2

| | | Example 7 | Example 8 | Comparative Example 1 | Comparative Example 2 |
|---|---|---|---|---|---|
| Composition | Monomer | Dicyclopentadiene/ tricyclopentadiene | Dicyclopentadiene/ tricyclopentadiene | Dicyclopentadiene/ tricyclopentadiene | Epoxy |
| | Catalyst | Formula (7) | Formula (8) | Formula (8) | — |
| | Dispersant | CHIRABAZOL H-818 | CHIRABAZOL H-818 | — | — |
| | Fused silica | FB-24 | FB-24 | — | — |
| | Amount of fused silica to be mixed (parts by weight) | 400 | 400 | — | — |
| Evaluation | Viscosity (Pa · s) | 0.9 | 0.95 | 0.02 | 0.55 |
| | Bending strength (MPa) | 33.5 | 31.2 | 90.1 | 129.2 |
| | Bending modulus (GPa) | 8.3 | 8.3 | 2.1 | 3.1 |
| | Linear expansion coefficient ($\times 10^{-6}$/° C.) | 13.1 | 14.0 | 72.2 | 68.1 |
| | Water absorption (%) | 0.09 | 0.11 | 0.11 | 1.95 |
| | Dielectric constant (1 MHz) | 2.98 | 2.95 | 3.12 | 3.82 |
| | (100 MHz) | 2.95 | 2.94 | 3.10 | 3.87 |
| | (1 GHz) | 2.91 | 2.98 | 3.13 | 3.78 |
| | Dielectric dissipation factor (1 MHz) | 0.0013 | 0.0015 | 0.0012 | 0.0150 |
| | (100 MHz) | 0.0013 | 0.0016 | 0.0012 | 0.0156 |
| | (1 GHz) | 0.0014 | 0.0015 | 0.0017 | 0.0153 |

TABLE 2-continued

|  |  | Comparative Example 3 | Comparative Example 4 | Comparative Example 5 |
|---|---|---|---|---|
| Composition | Monomer | Epoxy | Dicyclopentadiene/ tricyclopentadiene | Dicyclopentadiene/ tricyclopentadiene |
|  | Catalyst | — | Formula (8) | Formula (6) |
|  | Dispersant | PLENACT KR46B | SILA-ACE S210 | SILA-ACE S210 |
|  | Fused silica | FB-24 | — | — |
|  | Amount of fused silica to be mixed (parts by weight) | 400 | 300 (calcium carbonate) | 400 (calcium carbonate) |
| Evaluation | Viscosity (Pa · s) | 35 | 14 | 20 |
|  | Bending strength (MPa) | Unmeasurable | Unmeasurable | Unmeasurable |
|  | Bending modulus (GPa) | Unmeasurable | Unmeasurable | Unmeasurable |
|  | Linear expansion coefficient ($\times 10^{-6}$/° C.) | Unmeasurable | Unmeasurable | Unmeasurable |
|  | Water absorption (%) | Unmeasurable | Unmeasurable | Unmeasurable |
|  | Dielectric constant (1 MHz) | Unmeasurable | Unmeasurable | Unmeasurable |
|  | (100 MHz) | Unmeasurable | Unmeasurable | Unmeasurable |
|  | (1 GHz) | Unmeasurable | Unmeasurable | Unmeasurable |
|  | Dielectric dissipation factor (1 MHz) | Unmeasurable | Unmeasurable | Unmeasurable |
|  | (100 MHz) | Unmeasurable | Unmeasurable | Unmeasurable |
|  | (1 GHz) | Unmeasurable | Unmeasurable | Unmeasurable |

EXAMPLE 9

A flat plate made of a polymerizable composition and a cured resin composition was obtained by following the same procedure as that in Example 3 except for blending 700 parts by weight of FB550 (made by DENKI KAGAKU KOGYO KABUSHIKI KAISHA, average particle diameter: 11.2 μm) instead of 300 parts by weight of FB-24 as a fused silica, and the evaluations thereof were carried out. The results of evaluations were shown in Table 3.

EXAMPLE 10

A flat plate made of a polymerizable composition and a cured resin composition was obtained by following the same procedure as that in Example 3 except for blending 800 parts by weight of FB550 (made by DENKI KAGAKU KOGYO KABUSHIKI KAISHA, average particle diameter: 11.2 μm) instead of 300 parts by weight of FB-24 as a fused silica, and the evaluations thereof were carried out. The results of evaluations were shown in Table 3.

EXAMPLE 11

A flat plate made of a polymerizable composition and a cured resin composition was obtained by following the same procedure as that in Example 3 except for blending 800 parts by weight of FB940 (made by DENKI KAGAKU KOGYO KABUSHIKI KAISHA, average particle diameter: 14.9 μm) instead of 300 parts by weight of FB-24 as a fused silica, and the evaluations thereof were carried out. The results of evaluations were shown in Table 3.

EXAMPLE 12

A flat plate made of a polymerizable composition and a cured resin composition was obtained by following the same procedure as that in Example 10 except for using a ruthenium-based metathesis polymerization catalyst of Formula (8) as a metathesis polymerization catalyst, and the evaluations thereof were carried out. The results of evaluations were shown in Table 3.

EXAMPLE 13

A flat plate made of a polymerizable composition and a cured resin composition was obtained by following the same procedure as that in Example 10 except for using a ruthenium-based metathesis polymerization catalyst of Formula (10) as a metathesis polymerization catalyst, and the evaluations thereof were carried out. The results of evaluations were shown in Table 3.

TABLE 3

|  |  | Example 9 | Example 10 | Example 11 | Example 12 | Example 13 |
|---|---|---|---|---|---|---|
| Composition | Monomer | Dicyclopentadiene/ tricyclopentadiene | Dicyclopentadiene/ tricyclopentadiene | Dicyclopentadiene/ tricyclopentadiene | Dicyclopentadiene/ tricyclopentadiene | Dicyclopentadiene/ tricyclopentadiene |
|  | Catalyst | Formula (7) | Formula (7) | Formula (7) | Formula (8) | Formula (10) |
|  | Dispersant | CHIRABAZOL H-818 | CHIRABAZOL H-818 | CHIRABAZOL H-818 | CHIRABAZOL H-818 | CHIRABAZOL H-818 |
|  | Fused silica | FB-550 | FB-550 | FB-940 | FB-550 | FB-550 |
|  | Amount of fused silica to be mixed (parts by weight) | 700 | 800 | 800 | 800 | 800 |

TABLE 3-continued

| | | Example 9 | Example 10 | Example 11 | Example 12 | Example 13 |
|---|---|---|---|---|---|---|
| Evaluation | Viscosity (Pa · s) | 1.94 | 3.10 | 3.20 | 1.94 | 1.94 |
| | Bending strength (MPa) | 34.2 | 55.0 | 24.4 | 34.0 | 34.5 |
| | Bending modulus (GPa) | 14.0 | 16.6 | 15.0 | 14.2 | 14.3 |
| | Linear expansion coefficient ($\times 10^{-6}/°$ C.) | 12.1 | 11.4 | 11.8 | 10.0 | 10.1 |
| | Water absorption (%) | 0.005 | 0.007 | 0.005 | 0.005 | 0.005 |
| Dielectric constant | (1 MHz) | 3.15 | 3.24 | 3.21 | 3.22 | 3.18 |
| | (100 MHz) | 3.18 | 3.26 | 3.19 | 3.25 | 3.18 |
| | (1 GHz) | 3.19 | 3.26 | 3.19 | 3.22 | 3.24 |
| Dielectric dissipation factor | (1 MHz) | 0.0023 | 0.0029 | 0.0028 | 0.0026 | 0.0022 |
| | (100 MHz) | 0.0021 | 0.0026 | 0.0028 | 0.0023 | 0.0025 |
| | (1 GHZ) | 0.0025 | 0.0028 | 0.0029 | 0.0027 | 0.0026 |

Industrial Applicability

In accordance with the present invention, it is possible to provide the polymerizable composition and the cured resin composition, linear expansion coefficients of which are significantly improved without impairment of the excellent properties such as the heat resistance and the mechanical strength of norbornene-based resins.

What is claimed is:

1. A polymerizable composition,
   which comprises a polymerizable substance containing a norbornene-based monomer or oligomer as a main component, a metathesis polymerization catalyst and silica powder, the silica powder being contained in an amount of 200 parts by weight or more with respect to 100 parts by weight of the polymerizable substance and,
   further comprises at least one kind selected from the group consisting of a glycerin fatty acid ester, a polyglycerin polyricinoleate ester and a titanate-based coupling agent.

2. The polymerizable composition according to claim 1, wherein the silica powder is a surface treatment silica surface-treated with a fatty acid or a fatty acid ester.

3. The polymerizable composition according to claim 1, wherein the silica powder is contained in an amount of 200 to 1,000 parts by weight with respect to 100 parts by weight of the polymerizable substance.

4. The polymerizable composition according to claim 2, wherein the silica powder is contained in an amount of 200 to 1,000 parts by weight with respect to 100 parts by weight of the polymerizable substance.

5. A cured resin composition,
   which has a crosslinking structure formed by curing the polymerizable composition according to claim 2,
   the average linear expansion coefficient at a temperature of 20 to 100° C. being $3 \times 10^{-5}/°$ C. or less.

6. A cured resin composition,
   which has a crosslinking structure formed by curing the polymerizable composition according to claim 3,
   the average linear expansion coefficient at a temperature of 20 to 100° C. being $3 \times 10^{-5}/°$ C. or less.

7. A cured resin composition, which has a crosslinking structure formed by curing the polymerizable composition according to claim 2,
   the average linear expansion coefficient at a temperature of 20 to 100° C. being $3 \times 10^{-5}/°$ C. or less.

8. A cured resin composition, which has a crosslinking structure formed by curing the polymerizable composition according to claims 1,2,4 and 4.

9. A cured resin composition according to claim 8, wherein the water absorption after immersing for 24 hours in water of 23° C. is 1% by weight or less.

* * * * *

UNITED STATES PATENT AND TRADEMARK OFFICE
CERTIFICATE OF CORRECTION

| | | |
|---|---|---|
| PATENT NO. | : 6,977,284 B2 | Page 1 of 1 |
| APPLICATION NO. | : 10/504170 | |
| DATED | : December 20, 2005 | |
| INVENTOR(S) | : Takeharu Morita et al. | |

It is certified that error appears in the above-identified patent and that said Letters Patent is hereby corrected as shown below:

Line 33-38,

In column 22, please amend claims 7 and 8 as follows: should read;

7. (currently amended): A cured resin composition, which has a crosslinking structure formed by curing the polymerizable composition according to claim ~~2~~ 1, the average linear expansion coefficient at a temperature of 20 to 100 °C being $3 \times 10^{-5}$/°C or less.

Col. 22, line 39-41, should read;

8. (currently amended): A cured resin composition, which has a crosslinking structure formed by curing the polymerizable composition according to claims ~~1,2,4 and 4~~ 1,2,3, and 4, the average linear expansion coefficient at a temperature of 20 to 100 °C being $3 \times 10^{-5}$/°C or less, the bending strength measured according to a method specified in JIS K 7055 being 15 GPa or more, and the dielectric constant being 3.5 or less.

Signed and Sealed this

Twenty-ninth Day of August, 2006

JON W. DUDAS
*Director of the United States Patent and Trademark Office*